United States Patent [19]

Fukuda et al.

[11] Patent Number: 4,963,886
[45] Date of Patent: Oct. 16, 1990

[54] THERMAL PRINTING HEAD

[75] Inventors: Mitsuhiko Fukuda; Yoshiaki Nagato; Tutomu Nakamura, all of Kyoto; Masato Sakai, Ohtsu; Takashi Ueda, Tokyo, all of Japan

[73] Assignee: Rohm Co., Ltd., Kyoto, Japan

[21] Appl. No.: 503,849

[22] Filed: Apr. 3, 1990

[30] Foreign Application Priority Data

May 1, 1989 [JP] Japan ................... 1-51861[U]
May 2, 1989 [JP] Japan ................... 1-113040
May 2, 1989 [JP] Japan ................... 1-113041

[51] Int. Cl.⁵ .......................................... G01D 15/10
[52] U.S. Cl. .......................... 346/76 PH; 219/216; 346/139 C
[58] Field of Search ............ 346/76 PH, 139 C; 219/216 PH

[56] References Cited

U.S. PATENT DOCUMENTS 3,855,448 12/1974 Hanagata ......................... 219/216

FOREIGN PATENT DOCUMENTS 0092874 5/1985 Japan .................................. 219/216
0132356 9/1986 Japan .................................. 219/216
63-151466 6/1988 Japan .
63-221055 9/1988 Japan .

OTHER PUBLICATIONS

Regehr et al., "Thermal Printer Assembly", IBM Tech. Discl. Bulletin vol. 22, No. 84 1/80, pp. 3337-3341.

Primary Examiner—Bruce A. Reynolds
Assistant Examiner—Huan Tran
Attorney, Agent, or Firm—William H. Eilberg

[57] ABSTRACT

The present invention provides a thermal printing head which comprises an elongate heat sink plate, an elongate head circuit board mounted on the heat sink plate, a connector board partially overlapping the circuit board, and an elongate presser cover mounted on the heat sink plate to press the connector board into contact with the circuit board. The circuit board has a reduced number of connection terminals arranged locally at a central portion of the circuit board. The connector toward is correspondingly reduced in length. Thus, for pressing the connector board into uniform contact with the circuit board, it is only necessary to provide only a pair of pressure applying screws adjacent the central portion of the circuit board.

10 Claims, 5 Drawing Sheets

THERMAL PRINTING HEAD

BACKGROUND OF THE INVENTION

1. Field of the Invention:

This invention relates to a thermal printing head which is used for example to print on thermosensitive paper or to cause ink transfer from a thermal transfer ribbon or film onto printing paper. More particularly, the present invention relates to improvements in a thermal printing head of the type wherein a connector board is overlapped on a head circuit board for connection to external circuits.

2. Description of the Prior Art:

As is well known, thermal printing heads are widely used in facsimile machines to print transmitted information on thermosensitive paper. The thermal printing head is also used in printers of the type wherein the ink of a transfer ink ribbon or film is thermally caused to be transferred onto printing paper.

There are various types of thermal printing heads which include line-type heads and matrix-type heads. The line-type thermal printing head has a row (line) of multiple heating dots, as disclosed for example in Japanese Patent Application Laid-open No. 63-151466 or No. 63-221055. The matrix-type thermal printing head has a multiplicity of heating dots arranged in a matrix, as disclosed for example in U.S. Pat. No. 3,855,448 to Hanagata et al.

The present invention is directed primarily but not exclusively to the line-type thermal printing head. To clarify the objects of the present invention, reference is now made to FIG. 10 which shows a typical line-type thermal printing head.

As shown in FIG. 10, the prior art thermal printing head comprises an elongate head circuit board 21 adhesively mounted on an elongate heat sink plate 30. The head circuit board comprises a substrate 22 which is formed with a longitudinal row (line) of multiple heating dots 23 positioned adjacent one longitudinal side of the head circuit board. The substrate 22 is also formed with a conductor pattern which includes a common electrode 24 and connection terminals 25 located adjacent the other longitudinal side of the circuit board in a comb-like arrangement. The common electrode 24 has both ends 24a located also adjacent the other longitudinal side of the circuit board to serve as connection terminals together with the other connection terminals 25.

The substrate 22 of the head circuit board 21 also carries a plurality of drive IC's 26. These drive IC's are connected to the heating dots 23 through individual electrodes (not shown) which form part of the conductor pattern. The heating dots are also connected to the common electrode 24.

The comb-like connection terminals 25 are divided into groups corresponding in number to the drive IC's 26. The comb-like connection terminals in each group are wired to the corresponding drive IC to serve respectively as a data input terminal (DI), a data output terminal (DO), a source voltage terminal (VDD), a strobe terminal (STR), a grounding terminal (GND) for that particular drive IC. In other words, the respective drive IC's each have a required number of comb-like connection terminals of their own.

On the heat sink plate 30 is further mounted a strip-like flexible connector board 31 which is reinforced by a backing 32. In an assembled state, the backing 32 disposed clear of the head circuit board 21 to directly rest on the heat sink plate. The flexible board 31 has a front marginal portion 31a projecting beyond the backing to partially overlap the head circuit board 21. Though not shown, the underside of the flexible board is formed with connection terminals in corresponding relation to the connection terminals 24a, 25 of the head circuit board, and the backing 32 supports a connector having pins in conduction with the connection terminals of the flexible board.

An elongate presser cover 35 is arranged above the connector board 31, and fixed to the heat sink plate 30 by means of mounting screws 37. For this purpose, the presser cover and the connector board 31 (the backing 32 as well) are respectively formed with mounting holes 35a, 33 through which the mounting screws 37 are inserted into engagement with threaded holes 30a of the heat sink plate. The underside of the presser cover is provided with an elastic rod 36 for pressing the front marginal portion 31a into contact with the head circuit board 21 when the mounting screws are tightened up.

With the arrangement described above, since the connection terminals 24a, 25 of the head circuit board 21 are distributed over the entire length of the circuit board, the flexible connector board 31 together with the backing 32 must be correspondingly elongated. For instance, when printing on JIS-A4 size papers (JIS: Japanese Industrial Standards), the connector board must have a length of about 21 cm at least. When printing on JIS-B4 size papers, the connector board must have a length of 26 cm at least. Obviously, such elongation of the connector board and the backing leads to material waste in addition to causing weight increase.

More importantly, to ensure uniform terminal contact between the connector board and the head circuit board, it is necessary to use a sufficient number of mounting screws 37 to flexible connector board, which also necessitates provision of corresponding number of mounting holes 33, 35a, and threaded holes 30a. Further, all of the mounting screws 37 must be tightened up in a well controlled manner. All these prolong the time required for manufacturing the thermal printing head, thereby leading to production cost increase.

Moreover, the prior art thermal printing head has a serious problem of bending at the time of printing operation, thereby deteriorating the printing quality. The reason for such bending is as follows.

Generally, the heat sink plate 30 and the presser cover 35 are equally made of aluminum because this material is light in weight and yet easily formed into any desired shape. Therefore, these two parts have the same coefficient of linear expansion. However, the heat sink plate 30 receives heat immediately from the head circuit board 21, whereas the presser cover 35 receives heat indirectly through the mounting screws 37 with a time lag. Thus, at the time of initiating the actuation of the heating dots 23 or abruptly changing the actuating voltage for the heating dots, the heat transmitting time lag leads to a difference in the degree of longitudinal expansion between the heat sink plate and the presser cover at least before reaching a steady state.

According to the prior art arrangement shown in FIG. 10, the entire length of the presser cover 35 is fixedly mounted to the heat sink plate 30 by the mounting screws 37. Thus, when the presser cover and the heat sink plate are longitudinally expanded to different degrees, the thermal printing head as a whole bends longitudinally as a result of the so-called "bimetal phenomenon".

SUMMARY OF THE INVENTION

It is therefore an object of the present invention to provide a thermal printing head, particularly a line-type head, which can be manufactured at a reduced cost and which is capable of preventing unexpected bending at the time of printing operation.

Another object of the present invention is to provide a thermal printing head wherein a presser cover is provided at each end thereof with a special mounting means which, while fulfilling an intended mounting function, allows the presser cover to longitudinally displace relative to a heat sink plate.

A further object of the present invention is to provide a thermal printing head incorporating a connector board which is compatible with various types of connectors only with minor design changes.

According to the present invention, there is provided a thermal printing head comprising: a heat sink plate; a head circuit board mounted on the heat sink plate, the circuit board being provided with heating resistor means and a conductor pattern, the circuit board further being provided with drive elements for divisionally activating the resistor means, the conductor pattern including connection terminals; a connector board having output connection terminals in corresponding relation to the connection terminals of the head circuit board; a presser cover mounted on the heat sink plate 70 lie over the connector board; and pressure applying means for causing the presser cover to press the connector board against the head circuit board so that the output connection terminals come into contact with the connection terminals of the head circuit board; wherein the connection terminals of the head circuit board are arranged locally within a limited length which is substantially smaller than an overall length of the head circuit board, at least selected ones of the connection terminals of the head circuit board being commonly used for at least selected ones of the drive elements by means of wiring conductors formed on the head circuit board; and the pressure applying means is also provided locally for pressing the connector board only in the limited length.

In applying the present invention to a line-type thermal printing head, the heat sink plate, the head circuit board and the pressure cover are all made elongate, and the above-mentioned limited length is usually located at a central portion of the elongate head circuit board.

According to the arrangement described above, the connector board can be reduced in length to correspond to the above-mentioned limited length which, in the case of the line-type thermal head, should be preferably located in the central portion of the elongate head circuit board. Thus, the pressure applying means need only be provided locally for pressing the thus reduced connector board into contact with the central portion of the circuit board. Usually, it suffices to use only two pressure applying screws which require well controlled tightening. As a result, the thermal printing head of the present invention can be manufactured or assembled at a much lower cost than the conventional thermal head which requires a number of mounting or pressure applying screws to be tightened in a well controlled manner.

On the other hand, since both ends of the elongate presser cover need not press the connector board, the cover ends may be rendered longitudinally displaceable relative to the heat sink plate without using any mounting screws. In view of the assembly stability, however, each cover end should be preferably provided with an engaging or mounting member which allows the cover end to move longitudinally relative to the heat sink plate while preventing the cover end from displacing away from the heat sink plate. In either of these two alternative arrangements, the presser cover and the heat sink plate can linearly expand independently of each other, so that substantially no bending occurs due to the bimetal phenomenon.

Other objects, features and advantages of the present invention will be fully understood from the following detailed description given with reference to the accompanying drawings.

DETAILED DESCRIPTION

Figure 1:
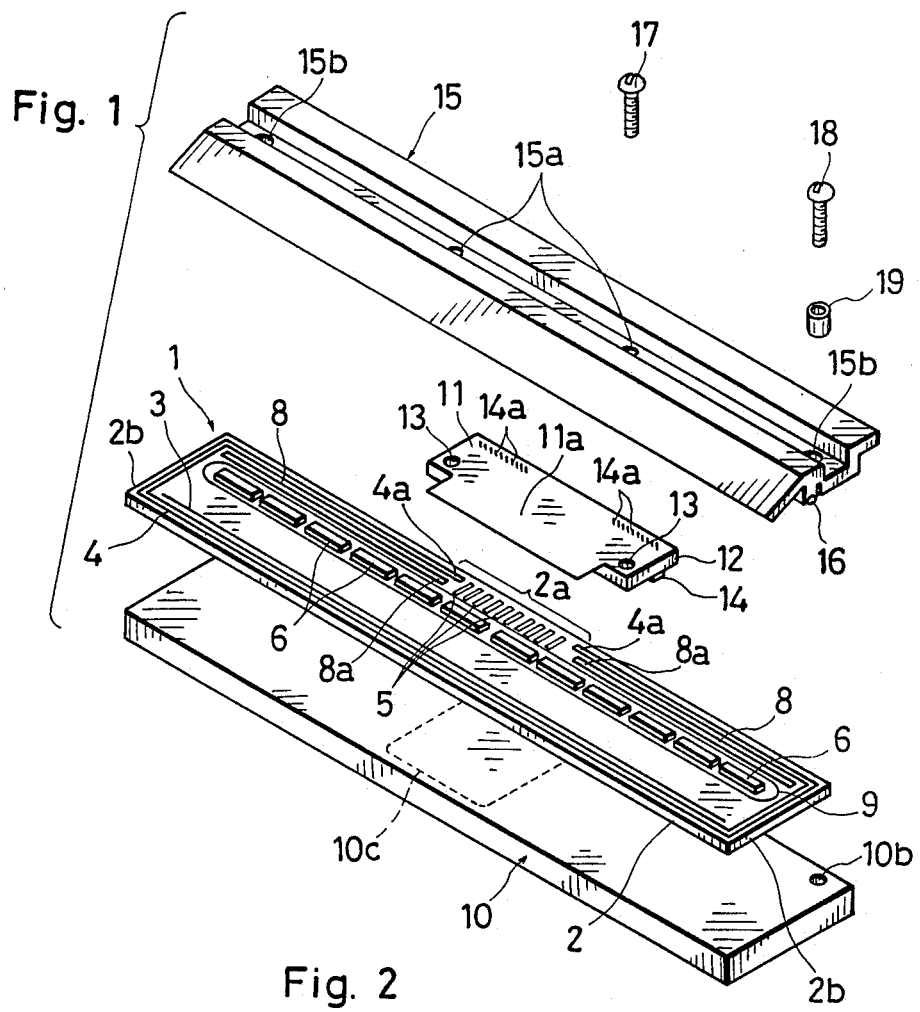
FIG. 1 is a perspective view showing a thermal printing head according to the present invention in an exploded state.
Figure 2:
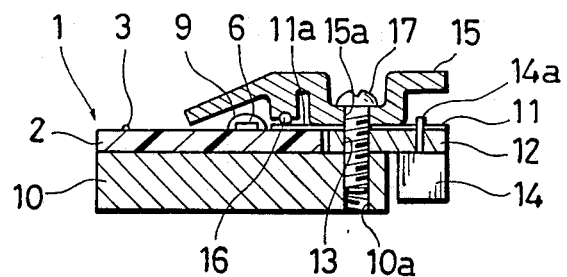
FIG. 2 is a side view, in central transverse section, of the same printing head in an assembled state.

Referring now to FIGS. 1 and 2 of the accompanying drawings, there is illustrated a line-type thermal printing head which mainly comprises an elongate head circuit board 1, an elongate heat sink plate 10, a flexible connector board 11, and an elongate presser cover 15. The details of these main parts are described below.

The head circuit board 1 includes an insulating substrate which is made for example of a ceramic material such as alumina. The head circuit board further includes a conductor pattern formed on the upper surface of the substrate 2. The conductor pattern includes a common driving electrode 4, connection terminals 5, wiring conductors 5a (see FIG. 3), individual driving electrodes 7 (see FIG. 3), and common grounding electrodes 8. The upper surface of the substrate also carries drive IC's 6, and a resistor line 3 extending along one longitudinal side adjacent thereto.

Figure 3:
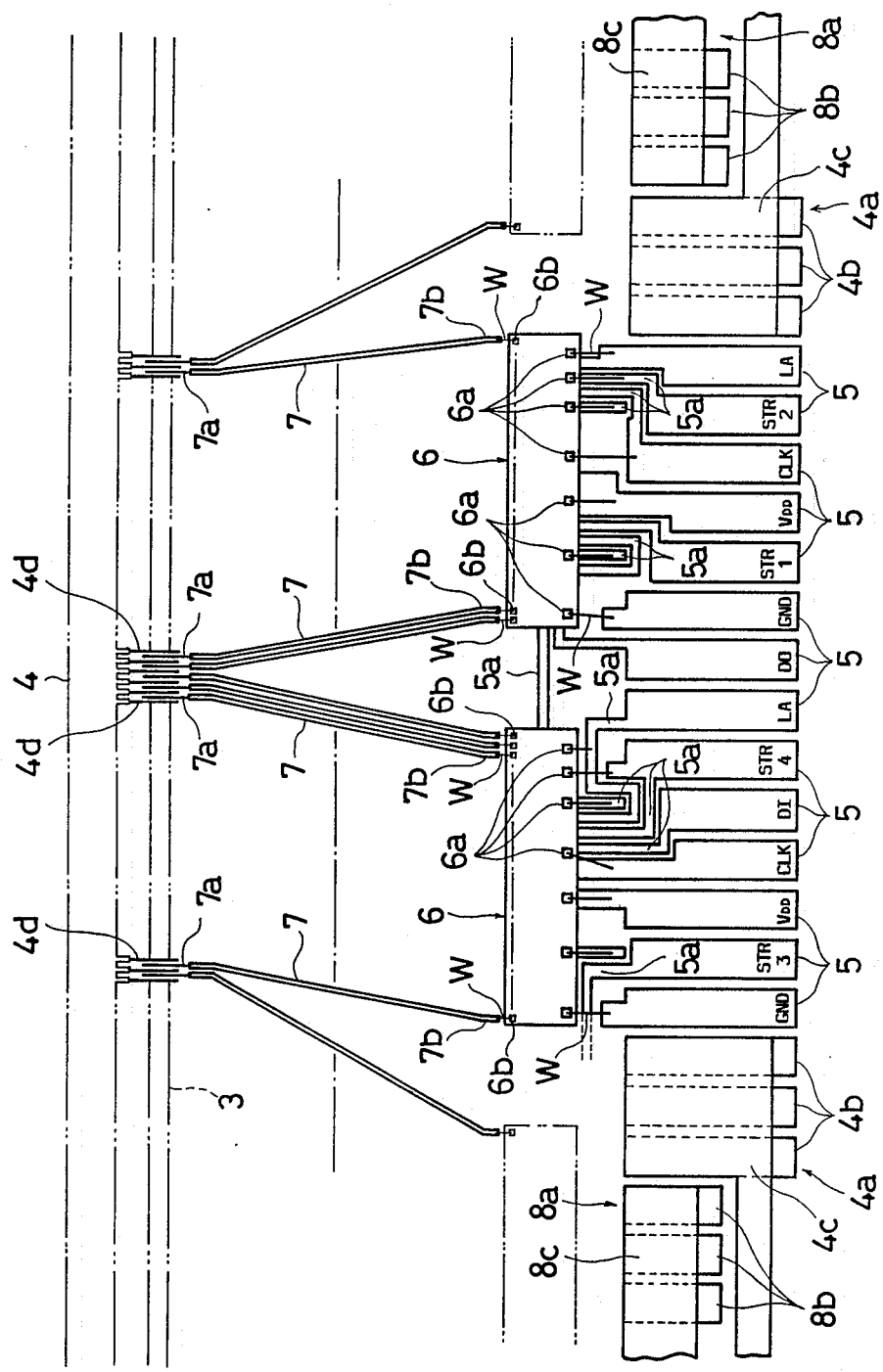
FIG. 3 is an enlarged plan view showing a conductor arrangement of a head circuit board incorporated into the same printing head.

The connection terminals 5 arranged in a comb-like manner are located only at a central portion 2a of the substrate adjacent the other longitudinal side thereof. As shown in FIG. 3, the connection terminals 5 include a data input terminal DI, a data output terminal DO, two latch terminals LA, two clock terminals CLK, two source voltage terminals VDD, four strobe terminals STR1–STR4, and two additional grounding terminals GND.

The additional grounding terminals GND are connected to respective grounding pads 6a of two central drive IC's 6 through wires W, whereas the other drive IC's are connected to the respective common grounding electrodes 8 through unillustrated wires. These additional grounding terminals are provided because it is difficult to directly connect the two central drive IC's to the common grounding electrodes 8 for reasons of arrangement.

The connection terminals 5 other than the additional grounding terminals GND are used commonly for all or selected drive IC's 6. According to the illustrated embodiment, for example, each of the data input and output terminals DI and DO is used commonly for all drive IC's. Each of the latch terminals LA, the clock terminals CLK, and the source voltage terminals VDD is used commonly for a half number of the drive IC's. Such common use of the connection terminals is achieved by the wiring conductors 5a each of which extends from a corresponding connection terminal 5 to be connected to corresponding pads 6a of the all or selected drive IC's 6 through wires W.

Figure 10:
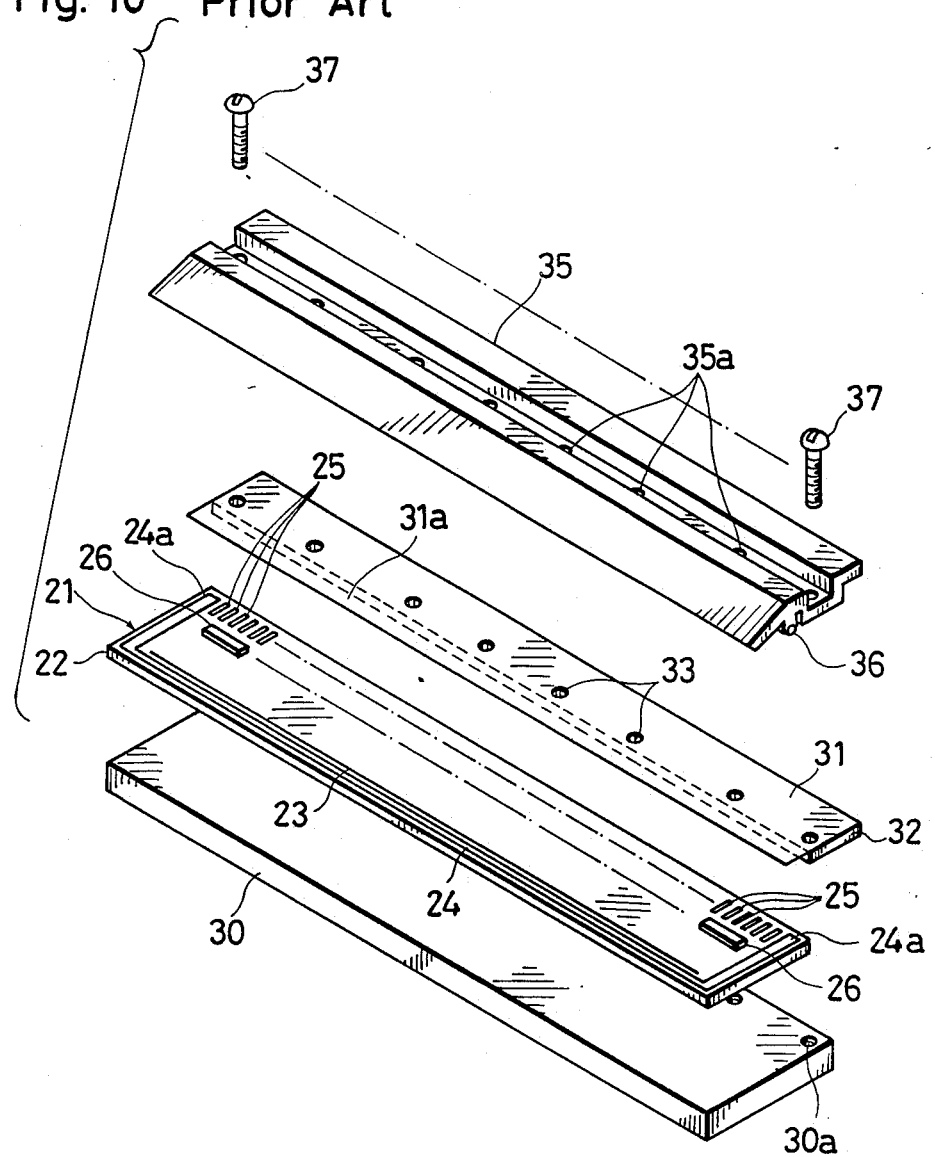
FIG. 10 is an exploded perspective view showing a prior art thermal printing head.

Obviously, the provision of the wiring conductors 5a, which enables common use of the connection terminals 5 relative to the drive IC's 6, reduces the required number of connection terminals, as compared to the conventional arrangement shown in FIG. 10. For this reason, it is possible to arrange the connection terminals 5 locally only at the central portion 2a of the substrate 2. It should be appreciated that FIG. 3 shows the wiring conductors 5a only partially, and that the specific arrangement pattern of the wiring conductors may be variable.

The common driving electrode 4 extends substantially all the way along all edges of the substrate 2, as shown in FIG. 1. The common driving electrode has two ends extending into the central portion 2a of the substrate to provide connection terminals 4a in side-by-side relation with the other connection terminals 5 referred to above. Each connection terminal 4a of the common electrode is provided with three conductor pads 4b commonly coated with silver paste 4c for lowering the resistivity, as shown in FIG. 3.

That portion of the common driving electrode 4 located adjacent the resistor line 3 is provided with comb-like teeth 4d in overlapping relation to the resistor line, as shown in FIG. 3. The resistor line constitutes a multiplicity of heating dots at intervals between the teeth 4d. The resistor line may be in the form of a thick layer or a thin layer.

The individual driving electrodes 7 have their end teeth 7a arranged in staggered relation to the comb-like teeth 4d of the common driving electrode 4, as shown in FIG. 3. The other ends 7b of the individual electrodes are located adjacent to the drive IC's and connected to corresponding pads 6b thereof through wires W. The individual electrodes extend obliquely to allow for the spacing between the drive IC's.

Each of the common grounding electrodes 8 has an inner end 8a located in the central portion 2a of the substrate 2, and extends longitudinally toward a corresponding end (shorter side) 2b of the substrate, as shown in FIG. 1. The inner end 8a of the grounding electrode, which serves as a connection terminal, is provided with three conductor pads 8b commonly coated with silver paste 8c for lowering the resistivity, as illustrated in FIG. 3.

As shown in FIG. 2, the drive IC's 6 together with the associated connecting wires W are enclosed in an insulating resin body 9 for protection.

The head circuit board 1 is mounted on the heat sink plate 10 which may be made of a good heat conductive metal such as aluminum. According to the illustrated embodiment, the head circuit board is adhesively bonded to the heat sink plate only at a central portion 10c thereof. Such local adhesive bonding is advantageous in that the two parts 1, 10 which are greatly different in thermal expansion coefficient can expand independently without bending which may be caused by the bimetal phenomenon.

The flexible connector board 11 is made for example of a polyimide film and reinforced by a backing 12 which may be made of glass-fiber-reinforced epoxy resin. Since the connection terminals 4a, 5, 8a of the head circuit board 1 are located locally at the central portion 2a of the substrate, the flexible board 11 together with the reinforcing backing 12 need only have a correspondingly reduced length, as compared to the prior art arrangement shown in FIG. 10. The reinforcing backing 12 supports, on its underside, a connector 14 having pins 14a. The connector may be adhesively bonded to the backing.

Figure 4:
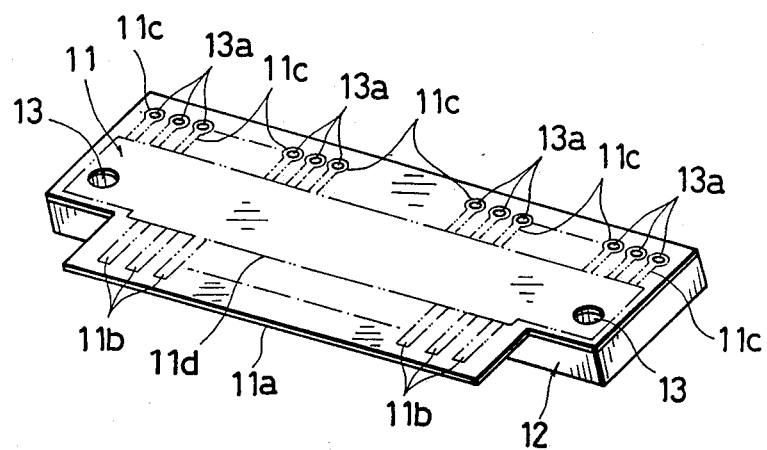
FIG. 4 is an enlarged perspective view showing a connector board incorporated into the same printing head.

As better shown in FIG. 4, the flexible connector board 11 has a front marginal portion 11a which projects beyond the reinforcing backing 12 and substantially corresponds in length to the central portion 2a of the substrate 2 (see also FIG. 1). In assembly, the front marginal portion 11a is overlapped on the central portion 2a of the substrate (see FIG. 2).

The underside of the flexible connector board 11 is formed at the front marginal portion 11a with output terminals 11b which come into contact with the connection terminals 4a, 5, 8a of the head circuit board 1. The flexible board is also formed with input terminals 11c which are used for connection to the pins 14a of the connector 14 (see FIG. 2). For this purpose, the flexible board and the backing are formed with insertion holes 13a at the positions of the input terminals 11c. Indicated at 13 are mounting holes which are used for mounting the flexible board and the presser cover 15, as hereinafter described.

According to the illustrated embodiment, the input terminals 11c of the flexible connector board 11 are larger in number than the output terminals 11b. Thus, it is possible to assign two or more input terminals 11c (connector pins 14a) to a selected output terminal 11b or each of selected output terminals depending on various requirements. Further, it is also possible to select from various combinations of the input terminals 11c to best suit a particular pin arrangement of a given connector as long as the pitch between the pins of that connector is compatible with the pitch between the input terminals. In other words, the provision of the input terminals 11c in such an excess number enables standardization of the flexible circuit board 11 for various types of connectors.

The flexible connector board is further formed at a region 11d with a wiring conductor pattern (not shown) for suitably connecting between the output terminals 11b and the input terminals 11c. The wiring conductor pattern may vary depending on the particular pin arrangement of the connector 14. However, the flexible board can be standardized with respect to the number and arrangement of the input terminals 11b, the output terminals 11c, the pin insertion holes 13a, and the mounting holes 13, so that the flexible board can be manufactured at a relatively low cost by utilizing standardized manufacturing devices (punching dies, and etc.).

The reinforcing backing 12 of the flexible board 11 is mounted on the heat sink plate 10 together with the presser cover 15 by means of two mounting or pressure applying screws 17 (only one shown in FIG. 1), as better shown in FIG. 2. For this purpose, the heat sink plate 10 is formed with a pair of threaded holes 10a corresponding in position to the mounting holes 13 of the backing 12, whereas the presser cover 15 is formed with a pair of non-threaded mounting holes also corresponding in position to the backing mounting holes 13. The pressure applying screws 17 are inserted through the mounting holes 15a, 13 of the presser cover 15 and the backing 12 into engagement with the threaded holes 10a of the heat sink plate 10.

In the assembled state shown in FIG. 2, the front marginal portion 11a of the flexible board 11 lies over the central portion 2a of the head circuit board 1. As a result, the output terminals 11b (see FIG. 4) of the flexible board 11 come into contact with the respective connection terminals 4a, 5, 8a (see FIGS. 1 and 3) of the head circuit board. To ensure such contact, the presser cover 15 is provided on its underside with an elastic rod 16 for pressing the front marginal portion 11a of the flexible board against the central portion 2a of the head circuit board. The elastic rod may be made for example of silicone rubber.

According to the present invention, the flexible board 11 need be uniformly pressed against only the central portion 2a of the head circuit board 1 because all of the connection terminals 4a, 5, 8 are locally disposed in this portion. Therefore, only the two mounting screws 17 need be tightened in a controlled manner to achieve such uniform pressing in that limited portion. This is much more advantageous than the conventional arrangement wherein all mounting screws for the presser cover need be carefully controlled with respect to their tightening torque.

According to the illustrated embodiment, both ends of the presser cover 15 is mounted to the heat sink plate 10 by using a pair of end mounting screws 18 (only one shown in FIG. 1). For this purpose, the presser cover is formed with a pair of end mounting holes 15b, whereas the heat sink plate is formed with a corresponding pair of end threaded holes 10b.

Figure 5:
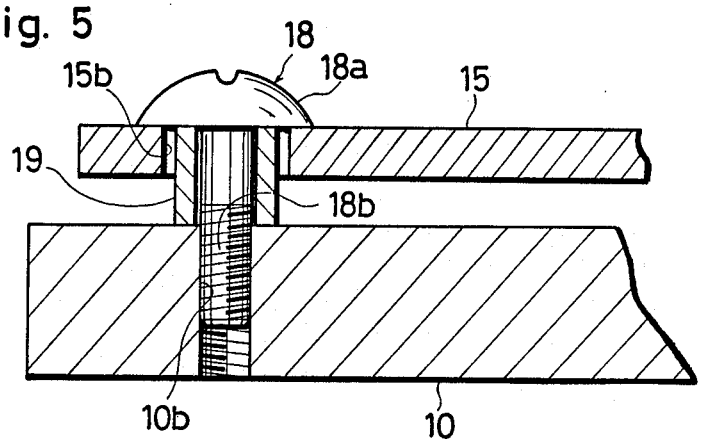
FIG. 5 is a sectional view showing a mounting structure at an end portion of the same printing head.

As better illustrated in FIG. 5, each end mounting hole 15b of the presser cover 15 is designed to loosely receive a spacer ring 19. In other words, the end mounting hole 15b is slightly larger in diameter than the spacer ring 19. The corresponding end mounting screw 18 has a head 18a engageable, from above, with the spacer ring 19 as well as the presser cover 15. The end mounting screw further has a threaded shank 18b insertable through the spacer ring into engagement with the corresponding end threaded hole 10b.

Obviously, with the arrangement shown in FIG. 5, the tightening torque or pressure of each end mounting screw 18 is substantially born by the corresponding spacer ring 19 even if the end mounting screw is strongly tightened up. Thus, the end mounting screw 18 serves only to prevent the cover end from displacing away from the heat sink plate 10.

In operation, the heating dots provided by the resistor line 3 are selectively activated by the drive IC's 6. The resulting heat is directly transmitted to the heat sink plate 10 for dissipation. The heat is also transmitted to the presser cover 15. However, since the presser cover is not in direct contact with the head circuit board such heat transmission is achieved indirectly through the intermediary of the screws 17, 18 and possibly the spacers 19. Therefore, the heat is transmitted to the presser cover 15 with a delay. Such a delay in heat transmission results in that the heat sink plate 10 and the presser cover 15 are thermally expanded to different degrees even if the presser cover is made for example of aluminum to have the same thermal expansion coefficient as the heat sink plate. Obviously, if no countermeasure is taken, the difference in thermal expansion between the heat sink plate and the presser cover causes unwanted bending which may deteriorate the printing quality of the thermal printing head.

According to the arrangement shown in FIG. 5, the end mounting screws 18 apply no or little pressure on both ends of the presser cover 15, and the spacer rings 19 are received loosely in the end mounting holes 15b. Thus, the ends of the presser cover can move freely relative to the heat sink plate 10 to compensate for the difference in thermal expansion between the heat sink plate and the presser cover. In this way, it is possible to prevent unwanted bending of the thermal printing head.

As already described, each end mounting hole 15b of the presser cover 15 may be diametrically larger than the corresponding spacer ring 19. Alternatively, the end mounting may be elongated longitudinally of the presser cover while having a width substantially corresponding to the diameter of the spacer ring.

Figure 6:
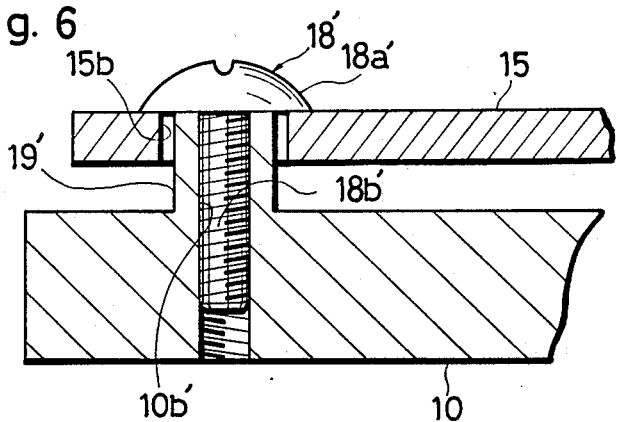
FIG. 6 is a sectional view similar to FIG. 5 but showing a modified mounting structure.

As an alternative of using separate spacer rings 19, the heat sink plate 10 may be integrally formed at each end thereof with an annular end projection 19', as shown in FIG. 6. In this case, each end threaded hole 10b' of the heat sink plate extends into the end projection, and a corresponding end mounting screw 18' with a head 18a' has a shank 18b' which is threaded over its entire length.

Figure 7:
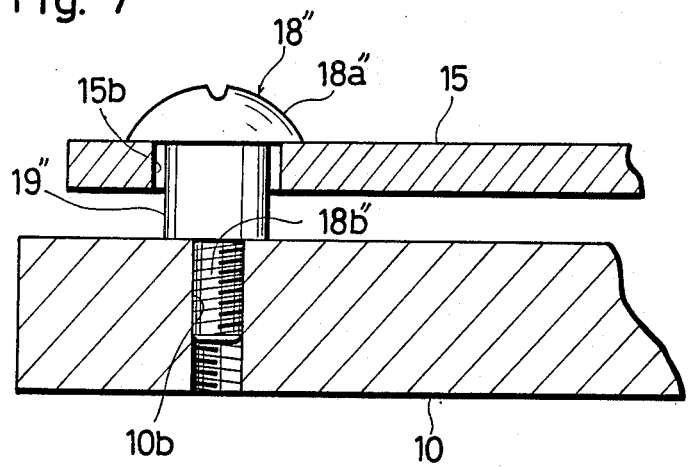
FIG. 7 is a sectional view also similar to FIG. 5 but showing another modified mounting structure.

As another alternative, use is made of an end mounting screw 18" which itself has an enlarged integral spacing portion 19" loosely fitted in each end mounting hole 15b of the presser cover 15, as shown in FIG. 7. One end of the screw spacing portion 19" rests on the heat sink plate 10 and has a threaded shank 18b". The other end of the screw spacing portion has a head 18a" for engagement with the presser cover 15 from above.

The presser cover 15 of the thermal printing head according to the present invention may be specially designed to have two central mounting holes 15a for the pressure applying screws 17, and two end mounting holes 15b for the end mounting screws 18. Alternatively, the presser cover 15 may be replaced by a conventional presser cover 15' shown in FIG. 8 or another conventional presser cover 15" shown in FIG. 9 as long as it has mounting holes 15a', 15b' (or 15a", 15b") at positions corresponding to the threaded holes 10a, 10b of the heat sink plate 10. Excess mounting holes of the alternative presser cover 15' (or 15") are not utilized.

Figure 8:
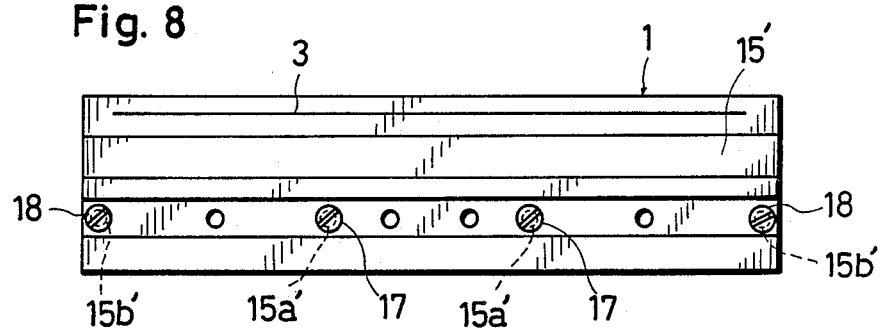
FIG. 8 is a plan view showing a conventional presser cover as used for the thermal printing head of the present invention.
Figure 9:
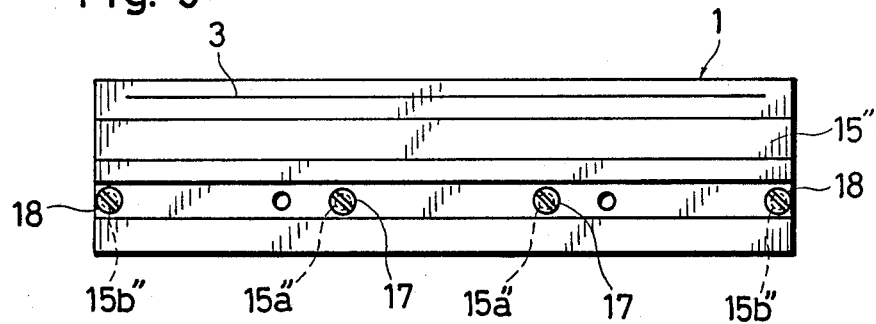
FIG. 9 is also a plan view showing another conventional presser cover as used for the thermal printing head of the present invention.

It is apparent from FIGS. 8 and 9 that the thermal printing head of the present invention requires less mounting screws than the conventional thermal head, and therefore can be assembled much more easily. This advantage is further strengthened by the fact that only the two pressure applying screws 17 need be tightened in a controlled manner.

The invention being thus described, it is obvious that the same may be varied in many other ways. For instance, the total number of the connection terminals including those of the common electrodes 4, 8 may be increased or decreased as long as they can be reasonably arranged in the central portion 2a of the head circuit board 1. Further, the end mounting screws 18 (or 18' or 18") together with their associated parts may be dispensed with because the pressure applying screws 17 also function to mount the presser cover 15 to the heat sink plate 10. Such variations are not to be regarded as a departure from the spirit and scope of the invention, and all such modifications as would be obvious to those skilled in the art are intended to be included within the scope of the following claims.

We claim:

1. A thermal printing head comprising:
   a heat sink plate;
   a head circuit board mounted on said heat sink plate, said circuit board being provided with heating resistor means and a conductor pattern, said circuit board further being provided with drive elements for divisionally activating said resistor means, said conductor pattern including connection terminals;
   a connector board having output connection terminals in corresponding relation to said connection terminals of said head circuit board;
   a presser cover mounted on said heat sink plate to lie over said connector board; and
   pressure applying means for causing said presser cover to press said connector board against said head circuit board so that said output connection terminals come into contact with said connection terminals of said head circuit board; wherein
   said connection terminals of said head circuit board are arranged locally within a limited length which is substantially smaller than an overall length of said head circuit board, at least selected ones of said connection terminals of said head circuit board being commonly used for at least selected ones of said drive elements by means of wiring conductors formed on said head circuit board; and
   said pressure applying means is also provided locally for pressing said connector board only in said limited length.

2. The thermal printing head as defined in claim 1, wherein said heat sink plate, said head circuit board and said presser cover are all elongate; and said limited length is located at a central portion of said head circuit board.

3. The thermal printing head as defined in claim 2, wherein said pressure applying means comprises a pair of pressure applying screws respectively located adjacent to both ends of said limited length, said pressure applying screws engaging into said heat sink plate with a controlled tightening force and serving also to mount said presser cover.

4. The thermal printing head as defined in claim 2, wherein said presser cover has both ends each of which is provided with an engaging member, said engaging member allowing said each end of said presser cover to move longitudinally relative to said heat sink plate while preventing said each cover end from displacing away from said heat sink plate.

5. The thermal printing head as defined in claim 4, wherein said engaging member comprises an end mounting screw which has a shank penetrating through an end mounting hole of said presser cover into engagement with said heat sink plate, said screw having a head engageable with said presser cover on the side thereof away from said heat sink plate, said end mounting hole loosely receiving spacer means which prevents said screw head from excessively approaching said heat sink plate.

6. The thermal printing head as defined in claim 5, wherein said spacer means is in the form of a separate spacer ring penetrated by said screw shank, said spacer ring being interposed between said screw head and said heat sink plate.

7. The thermal printing head as defined in claim 5, wherein said spacer means is in the form of an annular spacer projection integral with said heat sink plate, said spacer projection supporting said screw head and being formed with a threaded hole for engagement with said screw shank.

8. The thermal printing head as defined in claim 5, wherein said spacer means is in the form of an enlarged spacer portion integral with said screw shank, said spacer portion resting on said heat sink plate.

9. The thermal printing head as defined in claim 2, wherein said connector board further comprises input connection terminals in a larger number than said output connection terminals.

10. The thermal printing head as defined in claim 2, wherein said head circuit board is adhesively bonded to said heat sink plate only at a central portion thereof.

* * * * *